United States Patent [19]
Fukushi

[11] Patent Number: 5,168,467
[45] Date of Patent: Dec. 1, 1992

[54] SEMICONDUCTOR MEMORY DEVICE HAVING SENSE AMPLIFIER PROTECTION

[75] Inventor: Isao Fukushi, Yokohama, Japan

[73] Assignee: Fujitsu Limited, Kawasaki, Japan

[21] Appl. No.: 584,342

[22] Filed: Sep. 18, 1990

[30] Foreign Application Priority Data

Sep. 18, 1989 [JP] Japan .................................. 1-240205

[51] Int. Cl.$^5$ .............................................. G11C 7/00
[52] U.S. Cl. ......................... 365/189.06; 365/189.01; 365/190; 365/177
[58] Field of Search .................... 365/189.01, 190, 202, 365/177, 189.06, 189.07, 189.11, 205

[56] References Cited
U.S. PATENT DOCUMENTS 4,078,261  3/1978  Millhollan et al. ............ 365/189.09
4,825,413  4/1989  Tran .............................. 365/189.06

FOREIGN PATENT DOCUMENTS

89/07826  8/1989  World Int. Prop. O. .

OTHER PUBLICATIONS

Patent Abstracts of Japan, vol. 10, No. 12 (P-421) Jan. 17, 1986 & JP-A-60-167187 (Hitachi Seisakusho KK) Aug. 30, 1985.

Primary Examiner—Joseph A. Popek
Attorney, Agent, or Firm—Staas & Halsey

[57] ABSTRACT

A semiconductor memory device comprises a memory cell array, a column decoding unit supplied with first address data addressing a column of the memory cells for producing a column selection signal, a column switch unit supplied with the column selection signal for connecting a selected bit line to a corresponding common bit line, a row decoding unit supplied with second address data addressing a row of the memory cells for producing a word line selection signal, a plurality of sensing circuits each having an input terminal connected to a common bit line for detecting a voltage appearing on the common bit line, a plurality of writing circuits each connected a corresponding common bit line for writing the data into the addressed memory cell by causing a change in the voltage on the common bit line, and a disconnection circuit between the sensing circuit and the common bit line in each column of the memory cells wherein the disconnection circuit is controlled by the writing circuit such that the sensing circuit is selectively disconnected from the common bit line when the writing circuit writes the data into the memory cell.

8 Claims, 4 Drawing Sheets

SEMICONDUCTOR MEMORY DEVICE HAVING SENSE AMPLIFIER PROTECTION

BACKGROUND OF THE INVENTION

The present invention generally relates to semiconductor memory devices and more particularly to an improvement of a semiconductor memory device wherein bipolar transistors, p-channel metal-oxide-silicon (MOS) transistors and n-channel MOS transistors are provided on a common semiconductor substrate.

There is a semiconductor device of the type known as "BiCMOS" wherein bipolar transistors, p-channel MOS transistors and n-channel MOS transistors are provided as an integrated circuit on a common semiconductor substrate. Using such BiCMOS memory devices, versatile operational characteristic merging the advantageous feature of complementary MOS (CMOS) circuits and the advantageous feature of bipolar transistors are obtained.

In the case of semiconductor memory devices provided on a BiCMOS integrated circuit, MOS transistors are used for the memory cells and other driving circuits while bipolar transistors are used for the sense amplifiers. By adopting such a construction, an increased integration density and decreased power consumption can be achieved together with enhanced writing and reading speed.

In such a conventional semiconductor device, the writing of data into an addressed memory cell is made by causing a voltage change on a bit line connected to the addressed memory cell, while the reading of data from the addressed memory cell is made by detecting the voltage change on the bit line by the sense amplifier connected to the bit line. Thus, there is a chance that a large voltage change may occur at the input of the sense amplifier at the time of writing the data. In the case of the conventional semiconductor memory device of the BiCMOS construction, such a large voltage change at the input of the sense amplifier raises a problem in that the bipolar transistors used in the sense amplifier may be reversely biased in response to the large voltage change. In other words, there is a risk that the bipolar transistors used in the sense amplifier may be damaged or destroyed permanently because of the excessive reverse biasing applied at the time of writing the data.

Thus, there is a demand of BiCMOS semiconductor memory device wherein the risk of damaging the bipolar transistors used therein is eliminated and yet capable of operating at a high speed.

SUMMARY OF THE INVENTION

Accordingly, it is a general object of the present invention to provide a novel and useful semiconductor memory device wherein the foregoing problems are eliminated.

Another and more specific object of the present invention is to provide a semiconductor memory device having a sense amplifier for each of memory cell columns, wherein application of a large reverse bias voltage to bipolar transistors forming the sense amplifier at the time of writing data is eliminated.

Another object of the present invention is to provide a semiconductor memory device comprising a memory cell array in which a plurality of memory cells are arranged in a row and column formation, column decoding means supplied with first address data addressing a column of the memory cells including therein an addressed memory cell, for producing a column selection signal that selects the column wherein the addressed memory cell is included, column switch means supplied with the column selection signal for connecting a selected bit line, to which the memory cells in the selected column are connected, to a common data line, row decoding means supplied with second address data addressing a row of the memory cells including therein the addressed memory cell for producing a word line selection signal selecting a word line to which a selected row of the memory cells that includes the addressed memory cell therein is connected, a plurality of sensing means each having an input terminal connected to a corresponding common data line for detecting a voltage appearing on the common data line, and a plurality of writing means each connected to one of the common data lines, each of said plurality of writing means being supplied with input data for writing the data into the addressed memory cell by causing a change in the voltage on the common data line, so that the voltage change on the common data line is transferred to the addressed memory cell via the column switch and the selected bit line, wherein there is provided disconnection means between the the sensing means and the common data line in each column of the memory cells, said disconnection means being controlled by the writing means in the column of the memory cells such that the sensing means is selectively disconnected from the common data line when the writing means writes the data into the memory cell.

According to the present invention, the sensing means is disconnected from the writing means when the data is written into the memory cell. Thus, application of the large reverse bias voltage across the base and emitter of the bipolar transistor forming the sensing means is positively prevented and the problem of the adversary reverse biasing of the p-n junction formed at the base and emitter is eliminated. As a result of the present invention, the bipolar transistors can be used successfully for the sense amplifiers and the access time at the time of reading out data from the memory device is significantly improved without risking that the bipolar transistors may be damaged or destroyed by the large reverse biasing at the time of writing.

Other objects and further features of the present invention will become apparent when read in conjunction with attached drawings.

DETAILED DESCRIPTION

Figure 1:
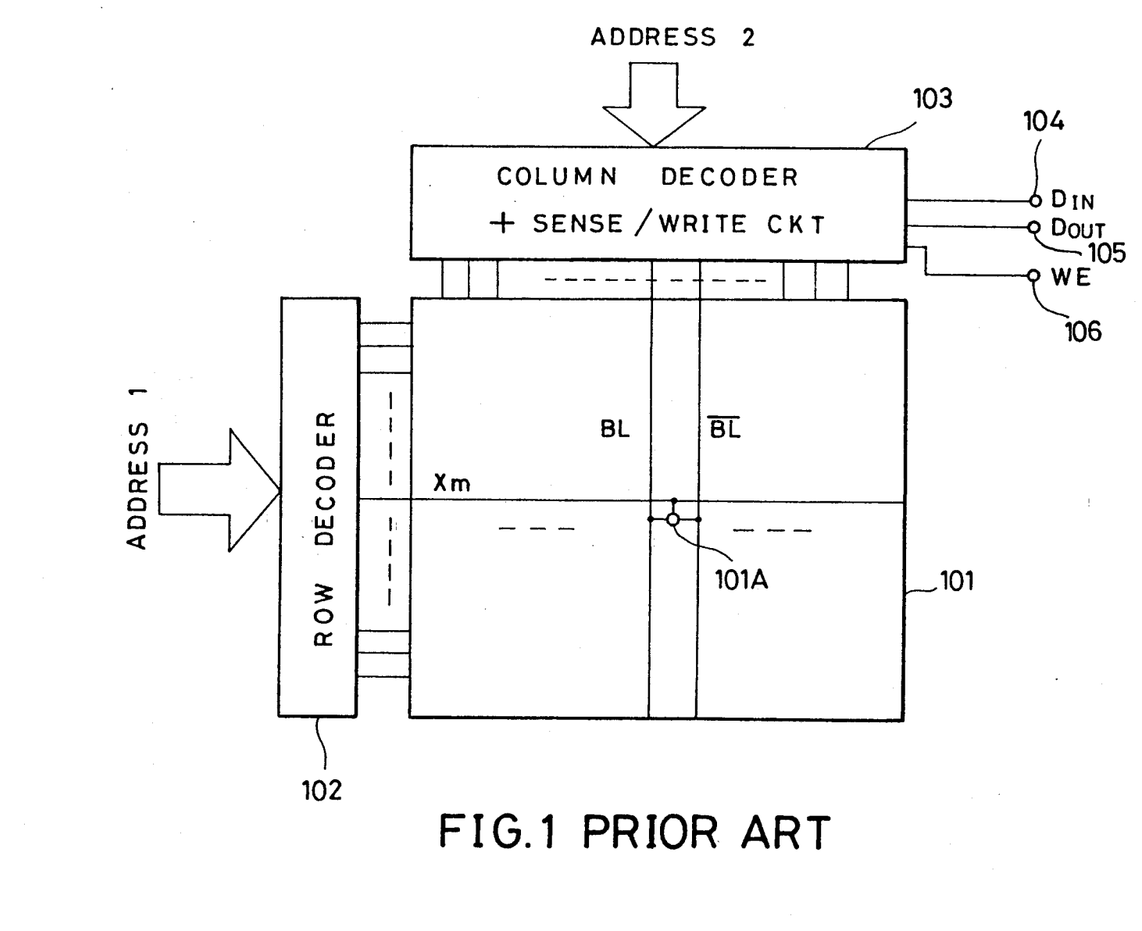
FIG. 1 is a block diagram showing the overall construction of a conventional semiconductor memory device.

FIG. 1 shows an example of the typical semiconductor memory device having the BiCMOS construction.

As usual, the semiconductor memory device comprises a memory cell array 101, a row decoder 102 connected to the memory cell array 101 for addressing a row of memory cells therein in response to address data ADDRESS1 supplied to the row decoder 102, and a column decoder 103 connected to the memory cell array 101 for addressing a column of memory cells in response to another address data ADDRESS2 supplied to the column decoder 103. Further, the column decoder 103 is supplied with input data Din at an input terminal 104 for writing the data Din into an addressed memory cell 101A which is the memory cell included commonly in the addressed row and column of the memory cells in the memory cell array 101. The reading of data from the addressed memory cell 101A is made also by the column decoder 103, wherein data Dout read out from the addressed memory cell is outputted from an output terminal 105. The writing of the data Din into the addressed memory cell is enabled by a write enable signal WE supplied to an input terminal 106 such that the writing is made only when the signal WE has a particular state such as a low level state.

Figure 2:
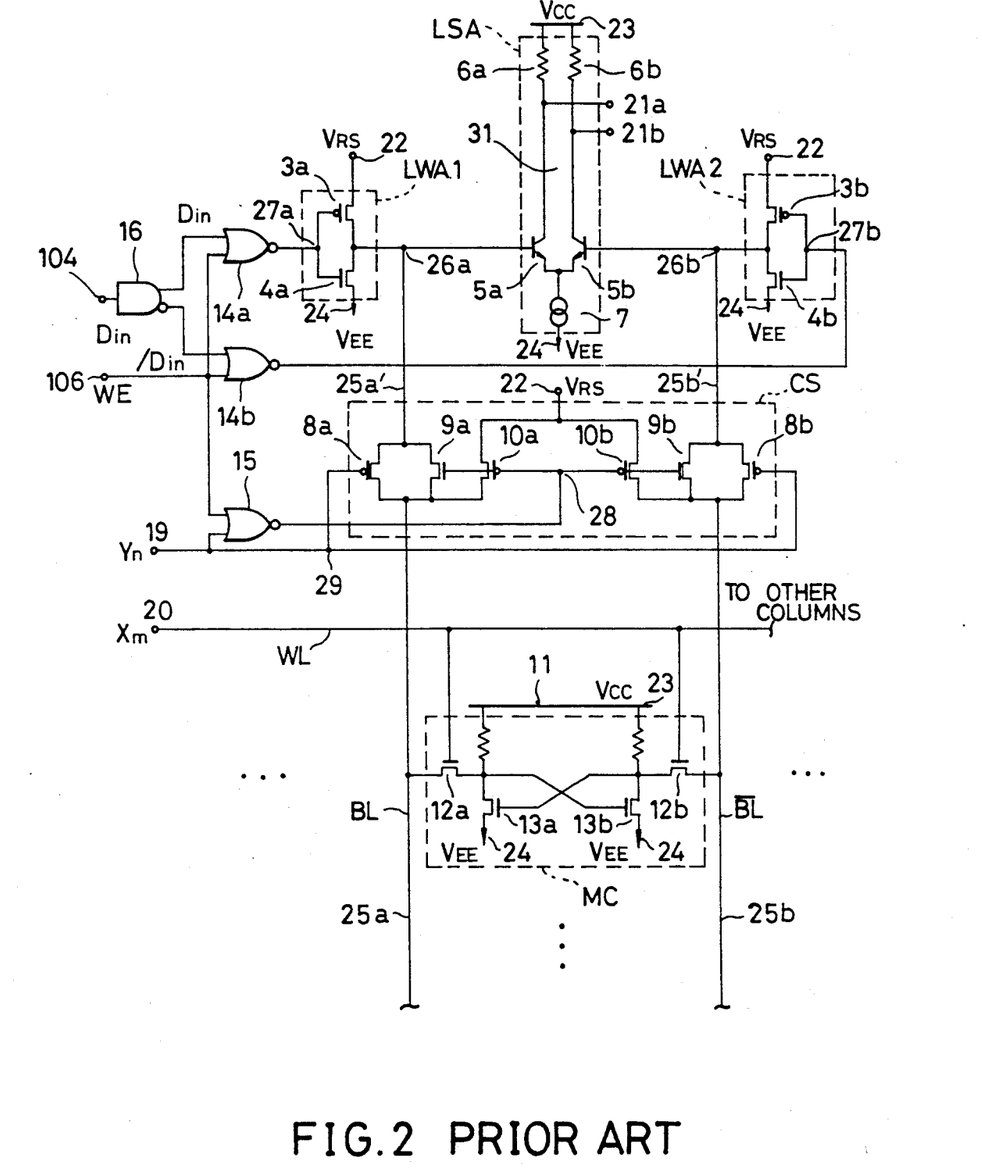
FIG. 2 is a circuit diagram showing a part of the semiconductor memory device of FIG. 1 for explanation of the problem addressed by the present invention.

FIG. 2 shows a circuit diagram of the conventional semiconductor memory device of FIG. 1.

Referring to FIG. 2, the semiconductor memory device is a static random access memory (SRAM) and generally comprises a local sense amplifier LSA, local write amplifiers LWA1 and LWA2, a column switch CS and a memory cell MC, wherein the local write amplifiers LWA1 and LWA2, the local sense amplifier LSA and the column switch CS are included in the column decoder 103 of FIG. 1. The memory cell MC is included in the memory cell array 101. The memory cell MC of FIG. 2 corresponds to the memory cell 101A of FIG. 1.

Referring to FIG. 2, the input data Din at the input terminal 104 is supplied, after passing through a gate 16 and a NOR gate 14a, to the local write amplifier LWA1, wherein the data Din is passed through the gate 16 as it is, though with a slight delay which will not be discussed here. Further, the data Din is supplied, after passing through the gate 16 and the NOR gate 14b, to the other local write amplifier LWA2, wherein the data Din is inverted to a data /Din when passed through the gate 16. Here, the NOR gate 14a and the NOR gate 14b control the passage of the input data Din selectively in response to the low level state of the write enable signal WE indicating the writing mode of the semiconductor memory device.

It should be noted that the data Din supplied to the local write amplifier LWA1 through the gate 14a and the data /Din supplied to the local write amplifier LWA2 through the gate 14b are relatively inverted with each other, such that when the data Din supplied to the LWA1 has a high level state, then the data /Din supplied to the LWA2 has a low level state, and vice versa.

The local write amplifier LWA1 includes a p-channel MOS transistor 3a and an n-channel MOS transistor 4a connected in series, wherein the transistor 3a has its source connected to a voltage source 22 providing a positive source voltage $V_{RS}$ and its drain connected, commonly with a drain of the transistor 4a, to a node 26a acting as an output node of the LWA1. The transistor 4a further has its source connected to a voltage source 24 that provides a negative source voltage $V_{EE}$. Further, the gates of the transistors 3a and 4a are connected commonly to a node 27a for receiving an output from the NOR gate 14a. Thus, when there is a high level signal at the output of the NOR gate 14a in response to the low level state of the input data Din and the low level state of the write enable signal WE, for example, the transistor 3a is turned off and the transistor 4a is turned. As a result, the voltage level at the node 26a is forcedly lowered to the level $V_{EE}$. On the other hand, when the level of the write enable signal WE is high indicating the reading mode of the semiconductor device, or when the level of the data Din is high, the voltage level appearing at the node 26a becomes high in response to the turning-on of the transistor 3a and the turning-off of the transistor 4a. In this state, the node 26a assumes a voltage level approximately equal to the voltage $V_{RS}$. The voltage at the node 26a in this state is smaller than the voltage $V_{RS}$ only by the voltage drop across the transistor 3a. As the operation of the other local write amplifier, LWA2, is substantially the same as that of the local write amplifier LWA1, the description thereof will be omitted. As already described, the voltage level at the node 26a and the voltage level at the node 26b are made complementary in that when the voltage level at the node 26a is high, the voltage level at the node 26b is low and vice versa.

The local sense amplifier LSA includes bipolar transistors 5a and 5b having respective bases connected to the node 26a and the node 26b. The transistors 5a and 5b further have collectors connected to a power voltage source 23 providing a positive source voltage Vcc via respective load resistances 6a and 6b, respectively. Further, the transistors 5a and 5b have emitters connected commonly to a constant current source 7. Thereby, the transistors 5a and 5b act as a differential amplifier such that any increase or decrease in the collector current in the transistor 5a, caused by the voltage difference between the node 26a and the node 26b, induces a corresponding decrease or increase in the collector current in the transistor 5b, and vice versa. The resultant difference in the collector voltages between the transistors 5a and 5b reflects the voltage difference across the nodes 26a and 26b, and the collector voltages of the transistors 5a and 5b are outputted at output terminals 21a and 21b as the output of the sense amplifier SA. The output terminals 21a and 21b are connected to an output sense amplifier (not shown in the drawing) via a data bus (not shown), and an output voltage corresponding to the voltage difference across the output terminals 21a and 21b are produced at the output terminal 105 of FIG. 1.

The column switch CS includes p-channel MOS transistors 8a and 8b, wherein the transistor 8a has a source connected to the node 26a via a common bit line 25a' and and a drain connected to a bit line 25a. Similarly, the transistor 8b has a source connected to the node 26b via a common data line 25b, and a drain connected to a bit line 25b which is a bit line conjugate with the bit line 25a. Further, the MOS transistors 8a and 8b have respective gates connected commonly at a node 29 which is connected to an input terminal 19. The terminal 19 is supplied with a selection signal Yn selecting the memory cell column in response to the decoding of the address data ADDRESS2 in the column decoder 103 (FIG. 1). Further, there are provided an n-channel MOS transistor 9a connected parallel to the p-channel MOS transistor 8a and another n-channel MOS transistor 9b connected parallel to the p-channel MOS transistor 8b, wherein the gate of the transistor 9a and the gate of the transistor 9b are connected commonly at a node 28 which is connected to an output terminal of a NOR gate 15.

The NOR gate 15 has a first input terminal to which the write enable signal WE is supplied and a second input terminal connected to the input terminal 19 to which the selection signal Yn is supplied. Thus, when the memory cell column including the memory cell MC is selected in response to the address data ADDRESS2, the selection signal Yn assumes a low level state and the transistors 8a and 8b are turned on in response thereto. Further, the NOR gate 15 produces a high level output in response to the low level write enable signal WE. Thereby, the transistors 9a and 9b are turned on also. When the transistors 8a, 8b, 9a and 9b are all turned on, the nodes 26a and 26b are connected respectively to the bit line 25a and the conjugate bit line 25b which extends along the selected memory cell column.

Further, there is provided a p-channel MOS transistor 10a and another p-channel MOS transistor 10b such that the source of the transistor 10a and the source of the transistor 10b are connected commonly to a voltage source 22 that provides the source voltage $V_{RS}$, the drain of the transistor 10a is connected to the bit line 25a, and the drain of the transistor 10b is connected to the bit line 25b. The transistors 10a and 10b further have gates connected commonly to the node 28 to which the output of the NOR gate 15 is supplied as already described. Thus, when the selection signal Yn has a low level state in correspondence to the selection of the memory cell column and when the write enable signal has the low level indicating the writing of data to the addressed memory cell in the selected memory cell column, the high level output produced by the NOR gate 15 turns off the transistors 10a and 10b. Thereby, the voltage source 22 providing the source voltage $V_{RS}$ is disconnected from the bit lines 25a and 25b.

In the case when the selection signal Yn assumes the low level state and when the write enable signal WE has the high level state in correspondence to the reading operation of the semiconductor memory device, the transistors 10a and 10b are turned on in response to the low level output of the NOR gate 15, and the positive voltage $V_{RS}$ is supplied to the bit lines 25a and 25b after a predetermined voltage drop at the transistors 10a and 10b.

Further, when the selection signal Yn assumes the high level state indicating the non-selected state of the memory cell column, the output of the NOR gate 15 assumes the low level state irrespective of whether the write enable signal WE has the low level state or not, and the positive volta $V_{RS}$ is supplied to the bit lines 25a and 25b after the predetermined voltage drop at the transistors 10a and 10b.

To the bit lines 25a and 25b, the memory cell column including the memory cell MC is connected. The memory cell MC comprises n-channel MOS transistors 12a and 12b each having a gate connected to a word line 20a to which a word line selection signal Xm is supplied from the row decoder 102 after decoding the address data ADDRESS1. The transistor 12a further has a drain connected to the bit line 25a, and the transistor 12b has a drain connected similarly to the bit line 25b. Each of the transistors 12a and 12b has a source connected a voltage source 11 providing the source voltage $V_{CC}$ via a resistor, and there are provided n-channel MOS transistors 13a and 13b connected to the transistors 12a and 12b so as to form a flip-flop circuit. Thus, the transistor 13a has a gate connected to the source of the transistor 12b, a drain connected directly to the source of the transistor 12a, and a source connected to the voltage source 24 that provides the negative source voltage $V_{EE}$. Similarly, the transistor 13b has a gate connected to the source of the transistor 12a, a drain connected directly to the source of the transistor 12b, and a source connected to the voltage source 24.

In operation of the memory cell MC, when one of the transistors 13a is turned on by suitable means, the voltage level at the drain of the transistor 13a is reduced and the resultant low level voltage is applied to the gate of the transistor 13b. In response thereto, the transistor 13b is turned off, and a high voltage level appears at the drain of the transistor 13b. This high voltage level, in turn, biases the transistor 13a to turn on, and thus, the state of the memory cell MC is maintained stably. The same operation applies also in the case in which the transistor 13b is turned on and the transistor 13a is turned off.

Next, the operation of the semiconductor memory device as a whole will be described together with the problem addressed by the present invention.

Referring to FIG. 1, when a memory cell 104 corresponding to the memory cell MC of FIG. 2 is addressed by the address data ADDRESS1 and ADDRESS2, the row decoder 102 produces the word line selection signal Xm having the high level and the memory cell column selection signal Yn having the low level. When not addressed, the signal Xm has the low level state and the signal Yn has the high level state. Thereby, the word line selection signal Xm is supplied to the input terminal 20 and the memory cell column selection signal Yn is supplied to the input terminal 19 of FIG. 2.

In the case when the memory cell MC is not addressed, the transistors 12a and 12b forming the transfer gate of the memory cell MC is turned off and the memory cell MC is disconnected from the bit lines 25a and 25b. Thereby, the memory cell MC holds its state as a result of the flip-flop operation of the memory cell transistors 13a and 13b.

When the memory cell MC is addressed and reading of data is going to be made therefrom, the write enable signal WE having the high level is supplied to the input terminal 106 as already described. In this case, the NOR gates 14a and 14b are set to a state for producing a low level output, and in response thereto, the transistors 4a and 4b are turned off and the transistors 3a and 3b are turned on. Thus, a voltage equal to the voltage $V_{RS}$ subtracted by the voltage drop across the transistors 3a and 3b, appear at the Further, the NOR gate 15 produces a low level output in response to the high level state of the write enable signal WE and the low level state of the memory cell column selection signal Yn supplied thereto, and the transistors 10a and 10b for supplying the source voltage $V_{RS}$ to the bit lines 25a and 25b are turned on accordingly.

On the other hand, the transistor 8a for connecting the bit line 25a to the node 26a and the transistor 8b for connecting the bit line 25b to the node 26b are all turned on by the low level state of the signal Yn. The transistors 9a and 9b, in turn, are turned off in response to the low level state of the output of the NOR gate 15. Thereby, the bit line 25a is connected to the node 26a and the bit line 25b is connected to the node 26b. As the transistors 10a and 10b are turned on as already described, and the electric current is supplied to the transistors 13a and 13b forming the memory cell MC. This electric current is caused to flow to the voltage source 24 through one of the transistors 13a and 13b, depending on the content of the data stored in the memory cell MC.

As the transistors 12a and 12b are turned on in this state because of the high level state of the word line selection signal Xm for selecting the word line 20a, the memory cell MC is connected to the local sense amplifier LSA via the bit lines 25a and 25b as well as via the nodes 26a and 26b, and thereby the reading of data is made by detecting the relative difference in the voltage level on the bit lines 25a and 25b by the sense amplifier LSA.

When writing data into the memory cell MC, the write enable signal WE is set to the low level state. In response thereto, the output of the NOR gate 15 assumes the high level state and the transistors 9a and 9b in the column switch CS are turned on while the transistors 10a and 10b are turned off. The transistors 8a and 8b remain turned on. Here, it is assumed that the selection signal Yn has the low level state in correspondence to the selection of the memory cell column.

In the case when the data Din to be written into the memory cell MC has the low level state corresponding to the data "0", the NOR gate 14a produces a high level output. The NOR gate 14a of course receives at its another input terminal the low level write enable signal WE. Thereby, the transistor 3a is turned off and the transistor 4a is turned on. As a result, the voltage level at the node 26a at the output of the LWA1 is forcedly decreased to the level $V_{EE}$ and this voltage change is transferred to the bit line 25a through the column switch CS. This large voltage decrease is further transferred to the drain of the MOS transistor 13a.

In the case when the transistor 13a is turned off and the transistor 13b is turned on in correspondence to the data "1" that is already stored in the memory cell MC, there is induced, in response to the writing of the data "0" to the memory cell MC, a change in the state of the transistor 13a from the turned-off state to the turned-on state as a result of transition of the transistor 13b from the turned-on state to the turned-off state. Thereby, the writing of data "0" to the addressed memory cell MC is accomplished by updating the content of the memory cell MC. In the case when the transistor 13b is turned off and the transistor 13a is turned on in correspondence to the data "0" that is already stored in the memory cell MC, the voltage decrease on the bit line 25a does not cause any transition of state of the transistors 13a and 13b.

On the other hand, the data /Din produced in conjugation with the data Din by the gate 16 has the high level state when writing the data "0" as the data Din. In this case, the NOR gate 14b produces the low level output and the transistor 3b is turned on while the transistor 4b is turned off. In other words, no voltage change occurs at the node 26b in contrast to the case of the node 26a, and the bit line voltage on the bit line 25b is not changed at the outset. However, the change in the state in the memory cell MC, caused in response to the updating of the content of the memory cell MC, causes the transition of state of the memory cell transistor 13b from the turned on state to the turned off state. When this occurs, the bit line voltage on the bit line 25b increases immediately.

The foregoing description applies exactly to the case of writing the data "1" into the memory cell MC when the description for the node 26a and the bit line 25a is changed with the description for the node 26b and the bit line 25b. Thus, the description for this case will be omitted.

In the foregoing description of the conventional semiconductor memory device, it will be understood that a large negative voltage ($V_{EE}$) is applied to the base of the transistor 5a or 5b of the local sense amplifier LSA at the time of writing the data. Thereby, the p-n junction at the base and emitter of the bipolar transistor is reversely biased. Thus, there is a risk that the p-n junction may be destroyed when the reverse bias voltage at the p-n junction has exceeded the breakdown voltage between the base and the emitter.

Generally, the bipolar transistors used in the integrated circuits have the breakdown voltage $BV_{EB}$ of about 5 volts. However, the breakdown voltage of the bipolar transistors is decreasing with increasing integration density. Often, the transistors can withstand the reverse biasing of only 2 or 3 volts.

The reverse bias voltage V actually applied across the base and the emitter of the bipolar transistor is represented as $$V = |V_{EE}| - |V_{RS}| - V_{BE}. \quad (V_{BE}=0.8 \text{ V})$$

wherein $V_{BE}$ is the base-emitter voltage drop. When this voltage V exceeds the breakdown voltage $BV_{EB}$, the transistor is damaged or destroyed permanently. In the case of the extremely miniaturized bipolar transistors having the self-aligned base, in particular, such a reverse biasing may cause a degrading in the common emitter current gain $h_{FE}$ even when the magnitude of the reverse biasing does not exceed the breakdown voltage $BV_{EB}$.

Next, the present invention for eliminating the problem of the conventional semiconductor memory device described heretofore will be discussed.

Figure 3:
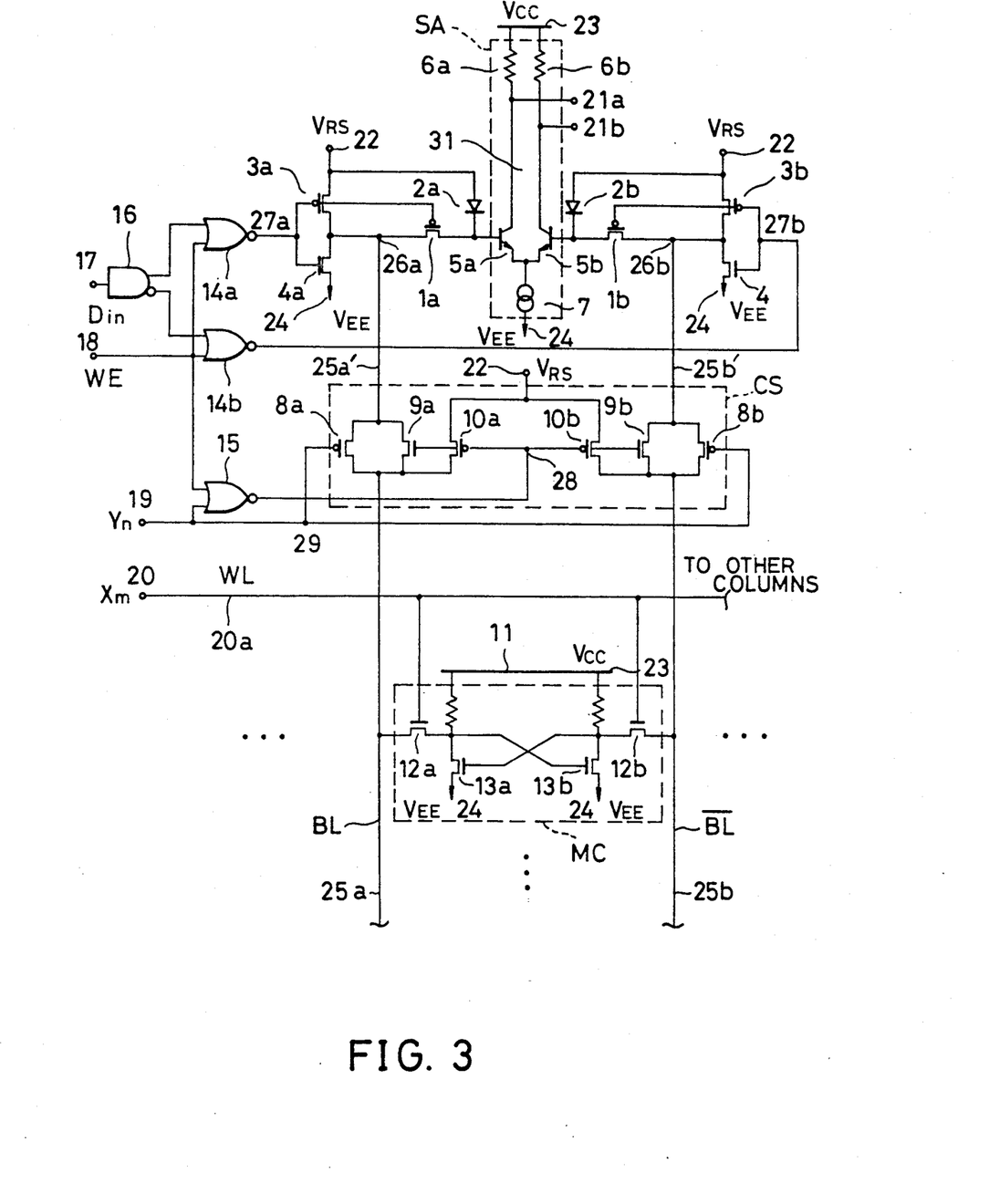
FIG. 3 is a circuit diagram showing an essential part of the semiconductor memory device according to a first embodiment of the present invention.

FIG. 3 shows a first embodiment of the present invention. In FIG. 3, these parts constructed and operated identically to those parts already described with reference to FIGS. 2 and 3 for the conventional semiconductor memory device are given identical reference numerals, and the description thereof will be omitted.

Referring to FIG. 3, there are provided p-channel MOS transistors 1a and 1b respectively between the node 26a and the base of the bipolar transistor 5a and between the node 26b and the base of the bipolar transistor 5b. The transistor 1a has its gate connected to the node 27a commonly with the gate of the transistor 3a, while the transistor 1b has its gate connected to the node 27b commonly with the gate of the transistor 3b. Thereby, the turning-on and turning-off of the transistor 1a is controlled by the voltage level appearing at the node 27a such that, when the transistor 3a is turned on, the transistor 1a is turned on, while when the transistor 3a is turned off, the transistor 1a is also turned off. Similarly, the turning-on and turning-off of the transistor 1b is controlled by the voltage level appearing at the node 27b such that, when the transistor 3b is turned on, the transistor 1b is turned on, while when the transistor 3b is turned off, the transistor 1b is also turned off.

It should be noted that the transistor 3a is turned off when the transistor 4a is turned on. In other words, the transistor 3a is turned off when there is a large negative voltage $V_{EE}$ at the node 26a. Thus, the transistor 1a, too, is turned off in response when there is the voltage $V_{EE}$ at the node 26a. Otherwise, the transistor 1a is turned on. Thus, the bipolar transistor 5a of the sense amplifier SA is selectively disconnected from the node 26a when there is the voltage $V_{EE}$ at the node 26a. Thereby, the risk that the transistor 5a may be damaged or destroyed due to the large reverse biasing applied between the base and emitter is substantially eliminated. The same holds true also for the transistor 5b. As the description for the operation of the transistor 1b for preventing the breakdown of the transistor 5b is obvious from the foregoing description, further description thereof will be omitted.

In the circuit of FIG. 3, there is further provided a diode 2a between the voltage source 22 and the base of the transistor 5a. Similarly, a diode 2b is provided between the voltage source 22 and the base of the transistor 5b. It should be noted that the diode 2a and the diode 2b hold the voltage on the base of the transistors 5a and 5b respectively, when the LSA is disconnected from the nodes 26a and 26b. More specifically, the voltage level of the base of the transistor 5a or the voltage level of the base of the transistor 5b is clamped at a level $V_{RS} - V_{BE}$, wherein $V_{BE}$ represents the voltage drop caused by the diode 5a or 5b and generally takes a value of about 0.8 volts. Thus, a stable output is obtained at the output terminals 21a and 21b of the LSA. It should be noted that these diodes 2a and 2b may be omitted.

Figure 4:
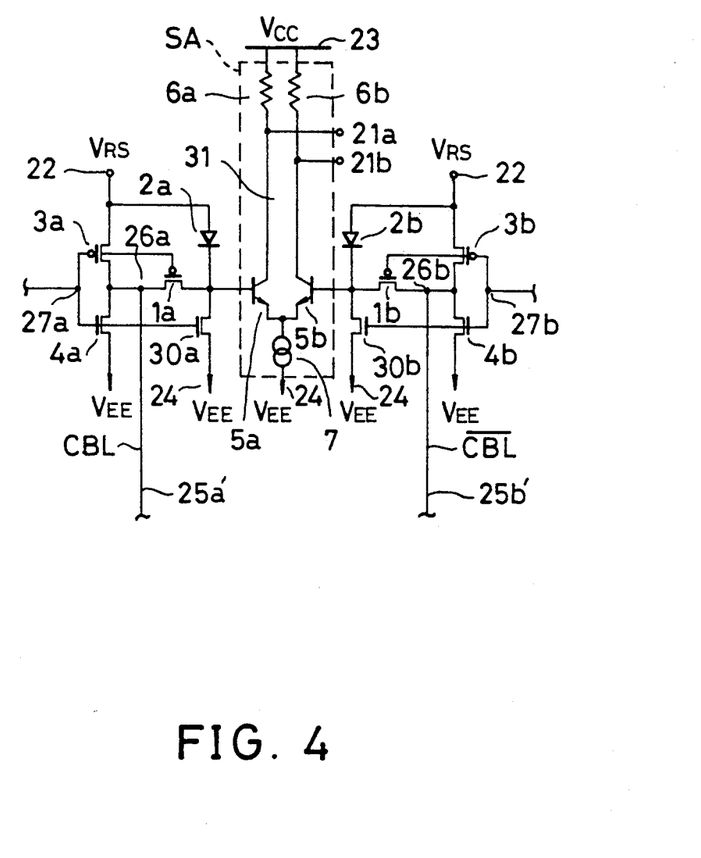
FIG. 4 is a circuit diagram showing a second embodiment of the semiconductor memory device of the present invention.

Next, a second embodiment of the present invention will be described with reference to FIG. 4. In FIG. 4, the parts described already are identified by the same reference numerals and the description will be omitted.

In this embodiment, there is provided an n-channel MOS transistor 30a having a drain connected to the base of the transistor 5a and a source connected to the voltage source 24. The transistor 30a further has a gate connected to the node 27a commonly with the gate of the n-channel MOS transistor 4a. Similarly there is provided another n-channel MOS transistor 30b having a drain connected to the base of the transistor 5b and a source connected to the voltage source 2b'.

In operation, when there is a high voltage level at the node 27a for writing the data "0" to the memory cell MC, for example, the transistor 1a is turned off. Further, the transistor 30a is turned on together with the transistor 4a, and the voltage at the base of the transistor 5a is lowered. Thus, although the transistor 5a is disconnected from the node 26a at the time of writing the data "0", a voltage change reflecting the writing of the data "0" appears at the base of the transistor 5a and the local sense amplifier LSA can detect the writing of the data thus performed. As there is provided a diode 2a between the voltage source 22 and the base of the transistor 5a, the voltage level at the base of the transistor 5a is clamped at a level $V_{RS} - V_{BE}$. Thus, the undesirable reverse biasing of the transistor does not occur even when the base voltage of the transistor 5a is lowered as such.

Similarly, when writing the data "1" to the addressed memory cell MC, the change in the voltage at the node 27b is detected by the transistor 30b. Thereby, a voltage change reflecting the writing of the data "1" into the addressed memory cell MC appears at the base of the transistor 5b, and the writing of the data "1" is detected by the local sense amplifier LSA.

Further, the present invention is not limited to these embodiments but various variations and modifications may be made without departing from the scope of the invention.

What is claimed is:

1. A semiconductor memory device comprising:

a memory cell array in which a plurality of memory cells are arranged in a plurality of rows and a plurality of columns;

a plurality of complementary bit line pairs, each of said complementary bit lines pairs including a pair of bit lines and connected commonly to a group of memory cells forming a column of the memory cells in the memory cells array;

a plurality of word lines each connected commonly to a group of memory cells forming a row of the memory cells in the memory cell array;

a common complementary bit line pair including a pair of bit lines;

column decoding means supplied with first address data addressing a selected column of the memory cells in which an addressed memory cell is included, for producing a column selection signal selecting the selected column in response to the first address data;

column switch means supplied with the column selection signal for connecting a selected complementary it line pair to said common complementary bit line pair;

row decoding means supplied with second address data addressing a selected row of the memory cells in which the addressed memory cell is included, for producing a word line selection signal selecting g a word line to which the memory cells in the selected row of the memory cells are connected commonly, said word line selection signal causing an electric connection of each of the memory cells that are included in the selected row of the memory cells to a corresponding complementary bit line pair;

a sense amplifier provided in correspondence to said common complementary bit line pair, said sense simplifier comprising a pair of bipolar transistors having respective bases connected to respective bit lines that form the common complementary bit one pair, said bipolar transistors having respective emitters connected with each other, said bipolar transistors detecting a voltage appearing across the bit lines that form the common complementary it line pair;

a amplifier provided in correspondence to said common complementary bit line pair, said writing amplifier being connected to the respective bit lines of the common complementary bit line pair, said writing amplifier being supplied with input data for writing amplifier being supplied with input data for writhing said data supplied thereto into the addressed memory cell by causing a change in the voltage across said bit lines that from the common complementary bit lien pair, so ah the voltage change on the common complementary bit line pair is transferred to the addressed memory cell via the column switch and the selected complementary bit line pair; and disconnection means provided between the sense amplifier and the common complementary bit line pair, said disconnection means being controlled by the writing amplifier such that the base of each of the bipolar transistors that form said sense amplifier is electively disconnected from the common complementary but line pair when the writing amplifier writes the data into the memory cell.

2. A semiconductor memory device as claimed in claim 1 in which, a first bipolar transistor of said bipolar transistors of the sense amplifier has a collector connected to a first voltage source, said emitter of the first bipolar transistor being connected to a second voltage source, wherein said disconnection means comprises a metal-oxide-silicon transistor connected between the base of said first bipolar transistor and the bit lines that form the common complementary bit line pair, said metal-oxide silicon transistor having a gate connected to the writing amplifier for receiving the input data supplied to the writing amplifier, said metal-oxide-silicon transistor being controlled such that the metal-oxide-silicon transistor is turned off when the writing amplifier causes the change in the voltage on the common complementary bit line air in response to the input data.

3. A semiconductor memory device as claimed in claim 2 further comprising clamping means for holding the base of the first bipolar transistor at a predetermined level when he metal-oxide-silicon transistor is turned off.

4. A semiconductor memory device as claimed in claim 3 in which said clamping means comprises a diode connected between a third voltage source and the base of the first bipolar transistor with a direction such that a p-n junction formed path the base and emitter of the first bipolar transistor is biased in a forward direction.

5. A semiconductor memory device as claimed in claim 3 further comprising voltage level modification means connected to the base o f the first bipolar transistor, said voltage level modification means being connected so as to receive the data that is supplied to the writing means, for causing a voltage change in the base of the first bipolar transistor in correspondence to the writing of the data into the addressed memory cell.

6. A semiconductor memory device as claimed in claim 5 in which said voltage level modification means comprises a metal-oxide-silicon transistor connected between the base of the first bipolar transistor and the second voltage source and having a gate connected so as to receive the input data.

7. A semiconductor memory device as claimed in claim 6 in which said clamping means comprises a diode connected between a third voltage source and the base of the first bipolar transistor with a direction such that a p-n junction formed at the base and emitter of the first bipolar transistor is biased in a forward direction.

8. A semiconductor memory device comprising:
a memory cell array in which a plurality of memory cells are arranged in a plurality of rows and a plurality of columns;
a plurality of bit line pairs each connected commonly to a group of memory cells forming a column of the memory cells in the memory cell array, each of said bit line pairs comprising a pair of bit lines;
column decoding means supplied with address data addressing a selected column of the memory cells in which an addressed memory cell is included;
sensing means comprising a pair of bipolar transistors having respective bases connected to respective bit lines that form said bit line pair and respective emitters connected commonly with each other, said sensing means detecting a voltage between the bit lines forming the bit line pair;
writing means connected to the bit lines forming said bit liner pair, said writing means being supplied with input data for writing the data supplied thereto into the addressed memory cell by causing a voltage change between said bit lines that form the bit line pair; and
disconnection means provided between the base of each of the bipolar transistors and the respective bit lines to which said base of each of the bipolar transistors is respectively connected, said disconnection means being controlled by the writing means such that the base of each of said bipolar transistors forming the sensing means is selectively disconnected from the respective one of said bit lines when the writing means writes the data into the memory cell.

* * * * *

UNITED STATES PATENT AND TRADEMARK OFFICE
CERTIFICATE OF CORRECTION

PATENT NO. : 5,168,467

DATED : December 1, 1992

INVENTOR(S) : Isao FUKUSHI

It is certified that error appears in the above-identified patent and that said Letters Patent is hereby corrected as shown below:

Column 5, line 49, change "volta" to --voltage--.

Column 6, line 48, after "the" insert --nodes 26a and 26b--.

Column 10, line 22, change "it" to --bit--;
    line 27, after "selecting" delete "g";
    line 39, change "one" to --line--;
    line 43, change "it" to --bit--;
    line 45, after "a" insert --writing--;
    line 50, delete "amplifier being supplied with input data for";
    line 51, delete "writhing";
    line 53, change "from" to --form--;
    line 54, change "ah" to --that--; and change "lien" to --line--
    line 65, change "but" to --bit--

Column 11, line 14, change "air" to --pair--;
    line 19, change "he" to --the--;
    line 25, change "path" to --at--; and

UNITED STATES PATENT AND TRADEMARK OFFICE
CERTIFICATE OF CORRECTION

PATENT NO. : 5,168,467
DATED : December 1, 1992
INVENTOR(S) : Isao Fukushi

It is certified that error appears in the above-indentified patent and that said Letters Patent is hereby corrected as shown below:

Column 11, line 29, change "o fthe" to --of the--

Signed and Sealed this

Eighth Day of February, 1994

*Attest:*

BRUCE LEHMAN

*Attesting Officer*  *Commissioner of Patents and Trademarks*